United States Patent [19]
Kanzawa et al.

[11] Patent Number: 4,984,035
[45] Date of Patent: Jan. 8, 1991

[54] MONOLITHIC LIGHT EMITTING DIODE ARRAY

[75] Inventors: Ryosaku Kanzawa, Ibaraki; Ken Takahashi; Hisumi Sano, both of Hitachi; Kazuhiro Kurata, Hachioji, all of Japan

[73] Assignee: Hitachi Cable, Ltd., Tokyo, Japan

[21] Appl. No.: 178,648

[22] Filed: Apr. 7, 1988

Related U.S. Application Data

[63] Continuation-in-part of Ser. No. 802,342, Nov. 25, 1985, abandoned.

[30] Foreign Application Priority Data

| Nov. 26, 1984 | [JP] | Japan | 59-249350 |
| Jul. 12, 1985 | [JP] | Japan | 60-152341 |
| Oct. 15, 1985 | [JP] | Japan | 60-229727 |
| Apr. 15, 1987 | [JP] | Japan | 62-91017 |

[51] Int. Cl.$^5$ .......................................... H01L 33/00
[52] U.S. Cl. ........................................ 357/17; 357/52; 357/47
[58] Field of Search ................... 357/52, 17.47, 55, 56, 357/60

[56] References Cited

U.S. PATENT DOCUMENTS

| 3,887,404 | 6/1975 | Chané | 60 X |
| 4,032,944 | 6/1977 | Van Dongen et al. | 357/17 |
| 4,236,122 | 11/1980 | Cho et al. | 357/56 X |
| 4,499,656 | 2/1985 | Fabian et al. | 357/56 X |

FOREIGN PATENT DOCUMENTS

| 58-66370 | 4/1983 | Japan | 357/17 |
| 57-111211 | 1/1984 | Japan | 357/17 |

OTHER PUBLICATIONS

Schnable, G., et al., "Passivation Coatings on Silicon Devices", J. Electrochem. Soc.; Solid State Science and Technology, Aug., 1975, pp. 1092-1103.
Surridge, R. K. et al., "Planar GaAs Mott Low Noise . . . ", Proc. of 11th Eur. Microwave Conf., Sep., 1981, pp. 871-875.
Ghandhi, S. K. *VLSI Fabrication Principles,* John Wiley, 1983, pp. 424-427.

*Primary Examiner*—Andrew J. James
*Assistant Examiner*—Sara W. Crane
*Attorney, Agent, or Firm*—Wenderoth, Lind & Ponack

[57] ABSTRACT

A monolithic light emitting diode array includes: at least one mixed crystal layer formed on a substrate by an epitaxial growth to provide a P-N junction at the boundary surface thereof; row of a plurality of light emitting diode portions each having the P-N junction; at least one forward mesa etching groove provided along the row of a plurality of light emitting diode portions on the at least one mixed crystal layer; a plurality of reverse mesa etching grooves provided so to be orthogonal to the at least one forward mesa etching groove and positioned between the plurality of light emitting diode portions on the at least one mixed crystal layer; a plurality of individual electrodes having electrode portions extending respectively to the plurality of light emitting diode portions so as to cross the at least one forward mesa etching groove, and a common electrode provided on a back surface of said substrate. Each of the emitting diode portions is surrounded by the forward and reverse mesa etching grooves so that the manufacturing thereof becomes easier and the characteristic thereof is improved.

2 Claims, 8 Drawing Sheets

MONOLITHIC LIGHT EMITTING DIODE ARRAY

CROSS-REFERENCE TO RELATED APPLICATIONS

This application is a continuation-in-part of now abandoned U.S. patent application Ser. No. 802,342, filed in the U.S. Patent and Trademark Office on Nov. 25, 1985.

BACKGROUND OF THE INVENTION

The present invention relates to a monolithic light emitting diode array, more particularly to a monolithic light emitting diode array having light emitting areas surrounded by forward and reverse mesa etching grooves formed so as to be orthogonal to each other.

A light emitting diode array is used, for example, for an electrostatic recording apparatus wherein a photosensitive drum is exposed to light emitted from the light emitting diode array driven in accordance with printing signals.

FIG. 1 shows an electrostatic recording apparatus which comprises: a light exposing means A including a light emitting diode array 1 and a lens array 2 for focussing light emitted from the diode array 1, an image developing means B for attaching magnetic toners to an electrostatic image on a photosensitive drum 3, a transfer corotoron D for transferring the toners on the drum 3 to a recording paper being carried in the direction of the arrow Z, a means E for removing an electrostatic potential of the drum by the exposure of light thereto, a means F for removing the remaining toners so as to clean the surface of the drum 3, a charge corotoron G for charging the surface of the drum 1 with a uniform electrostatic potential, and a means H for fixing the toner image transferred to the recording paper by heating and pressing the toner image on the paper.

FIG. 2 shows a light exposing means A including a light emitting diode array 1 and a lens array 2. The lens array 2 consists of a plurality of rod-like lenses each having self-focussing function of light 2a emitted from the light emitting diode array 1.

In operation, the photosensitive drum 3 rotates in the clockwise direction and the surface thereof is charged uniformly in accordance with the discharge of the charge corotoron G. The charged drum 3 is exposed by light emitted from the diode array 1 driven in accordance with recording signals so as to produce electrostatic image thereon. The electrostatic image on the drum 3 is developed by receiving toners from the developing means B when it passes a contact point with the developing means B in the clockwise rotation thereof. The developed image with toners on the drum 3 is transferred to the recording paper being carried in the direction of arrow Z by electrostatic field produced by the transfer corotoron D. The transferred image on the recording paper is fixed by the heat and pressure of the fixing means H to provide a completely recorded paper. Finally, the electrostatic image of the drum 3 is erased by light exposure of the means E for removing the electrostatic potential of the drum 3 and the remaining toners on the drum 3 are removed by the cleaning means F so as to thereby finish one recording cycle of an electrostatic recording system.

FIGS. 3 to 5 show a monolithic light emitting diode array which is used, for example, for such an electrostatic recording apparatus. The light emitting diode array compress an N-type galium arsenide (hereinafter called "GaAs") substrate 10, an N-type GaAs$_{1-x}$P$_x$ layer 11 formed by epitaxial growth (x: a mixed crystal ratio), an N-type GaAs layer 12, P-type light emitting recombination portions 13 each formed through the surface of the N-type GaAs layer 12 by the preferential diffusion of Zn, isolation stripes 14 each formed by the same method used for the formation of the light emitting recombination portions 13 for isolating the respective light emitting recombination portions 13, individual electrodes 15 provided on the respect light emitting portions of the N-type GaAs layer 12 and to which a positive potential is applied, and a common electrode 16 provided on the back surface of the N-type GaAs substrate 10 and to which a negative potential is applied. The N-type GaAs layer 12 and each of the electrodes 15 are provided with an aperture 17 respectively for the extraction of the light emitted beneath the respective light emitting recombination portion 13.

In operation, electrons are injected from the N-type GaAs$_{1-x}$P$_x$ layer 11 to the P-type light emitting recombination portions 13 when a forward bias potential is applied between the respective positive electrodes 15 and the common negative electrode 16 whereby light emitted in accordance with the light emitting recombination is radiated to the outside as shown by the arrow L, from the apertures 17 each of which is provided in the N-type GaAs layer 12 and each of the electrodes 15 respectively.

According to the above mentioned light emitting diode array, the uniform brightness is obtained in accordance with the light extracted from the aperture 17, as shown by solid line in FIG. 6, wherein the points $x_1$ to $x_5$ in the distance correspond to those of the light emitting recombination portion 13 and the aperture 17 of FIG. 5. This is reason why the approximately uniform flow of electric current is provided in the area of the points $X_1$ to $X_4$ because the electrode 15 extends up to the point $X_4$. In FIG. 6, the dotted line indicates light energy generated in the light recombination portion 13.

According to the monolithic light emitting diode array mentioned above, however, the following disadvantages have been found in accordance with a study by the inventors. (1) There is a limitation to an increase in the amount of light to be emitted with regard to a relatively wide junction area between the P-N layers for the reason there is a fear that the electrode 15 is subject to breakage when the aperture 17 is made bigger so as to extract a greater amount of light since the remaining portion of the electrode 15 near which the aperture is formed inevitably becomes narrower. (2) The process for manufacturing a light emitting diode array, for instance, including a step of forming diffusion mask is complicated because of the preferential diffusion of Zn is adopted. (3) The costs for the manufacture of a light emitting diode array is relatively high because of the preferential diffusion of Zn. (4) There is a fear that the yield becomes low for the reason why there is a tendency to make an unsuitable diffusion, especially at crystal defect portions because the preferential diffusion of Zn includes an interstatial step. (5) In general, it is desirable for a positive potential to be applied to the common electrode while a negative potential is applied to individual electrodes for driving a light emitting diode array. In this regard, it is said to be disadvantage that the negative potential is applied to the common electrode for the reason that a practical doner diffusion source in a III-V group compound semi-conductor is unavailable so that only an N-type substrate can be utilized. (6) It is rather difficult to manufacture a light emitting diode array of a fine device structure for the reason that the process for wire-bonding is inevitable because the respective electrodes for the respective light emitting portions are wired by leads. (7) The light generated in the light emitting recombination portion tends to leak to other area as shown by arrow Y in FIG. 5 thereby decreasing the quality of the printing image where the light emitting diode array is used, for instance, for an electrostatic recording apparatus.

SUMMARY OF THE INVENTION

Accordingly, it is an object of the present invention to provide a monolithic light emitting diode array wherein an area of a light-emitting portion is larger and the light generation efficiency is higher.

It is another object of the present invention to provide a monolithic light emitting diode array which is manufactured without a step of preferential diffusion.

It is yet another object of the present invention to provide a monolithic light emitting diode array which is manufactured with lower costs and an easier and simpler process.

It is a further object of the present invention to provide a monolithic light emitting diode array which is manufactured with a yield which is not affected even in the presence of crystal defects.

It is a still further object of the present invention to provide a monolithic light emitting diode array wherein wire-bonding is not always required in the manufacturing process thereof.

It is a yet still further object of the present invention to provide a monolithic light emitting diode array wherein light generated in the light emitting recombination portion does not leak to other areas.

According to the present invention, a monolithic light emitting diode array comprises: at least one mixed crystal layer formed on a GaAs substrate by epitaxial growth to provide a P-N junction at the boundary surface thereof, a row of a plurality of light emitting diode portions each having said P-N junction, at least one forward mesa etching groove provided along said row of a plurality of light emitting diode portions on said at least one mixed crystal layer, a plurality of reverse mesa etching grooves provided so as to be orthogonal to said at least one forward mesa etching groove and positioned between said plurality of light emitting diode portions on said at least one mixed crystal layer, a plurality of individual electrodes having electrode portions extending respectively to said plurality of light emitting diode portions so as to cross said at least one forward mesa etching groove, and a common electrode provided on the back surface of said GaAs substrate.

In the light emitting diode as shown, for instance, in FIG. 8 of the present application, cracks often occur on parts of the electrical isolation layer 25 or resultant partial exfoliations thereof due to protrusions or flaws produced on the surfaces of the layers on which the electrical isolation layer 25 is provided due to the presence of melting scars produced at the time of liquid phase epitaxy, crystal dislocations latent in GaAs crystal substrate, and defects of layers to be grown. In other words, cracks of the layer 25 are produced at the aforementioned protrusions working as nucleuses therefor so as to thereby result in exfoliations thereof when the layer 25 is grown on the layers having the protrusions or flaws. Such a phenomenon is often observed during the fabrication of a light emitting diode so as to thereby reduce the manufacturing yield. As a matter of course, such defects are found in products after a final examination, and in products even after such a life accelerating test as a high temperature exposure test or heat-cycle test.

Accordingly, it is another object of the present invention to provide a light emitting diode in which cracks or exfoliations of an electrical isolation layer are avoided so as to thereby increase the manufacturing yield and reliability thereof.

These and other objects of the present invention will become apparent in conjunction with the following description and drawings which are included for illustration purposes only.

DESCRIPTION OF THE PREFERRED EMBODIMENTS

Figure 1:
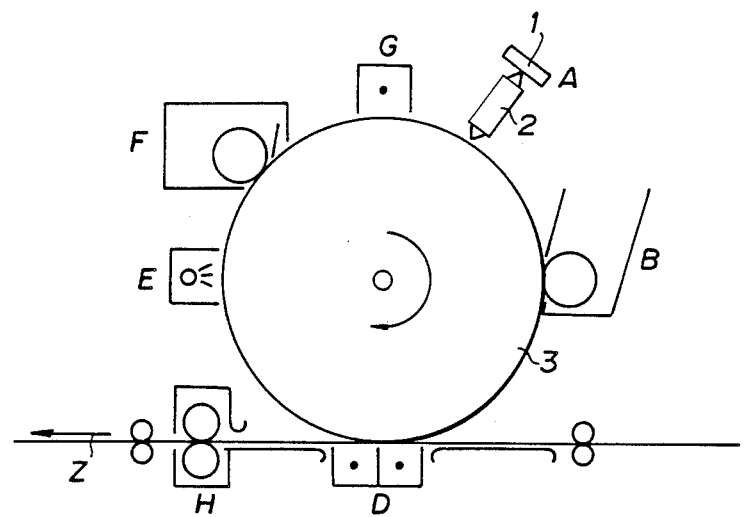
FIG. 1 is an explanatory view for illustrating an electrostatic recording apparatus.
Figure 2:
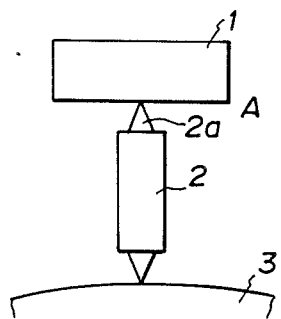
FIG. 2 is an explanatory view for illustrating a light exposing means utilized in the electrostatic recording apparatus.
Figure 3:
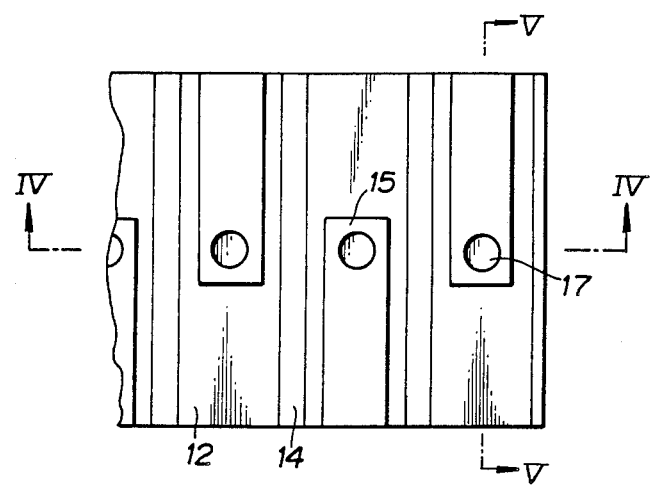
FIG. 3 is a plane view for illustrating a prior art monolithic light emitting diode array.
Figure 4:
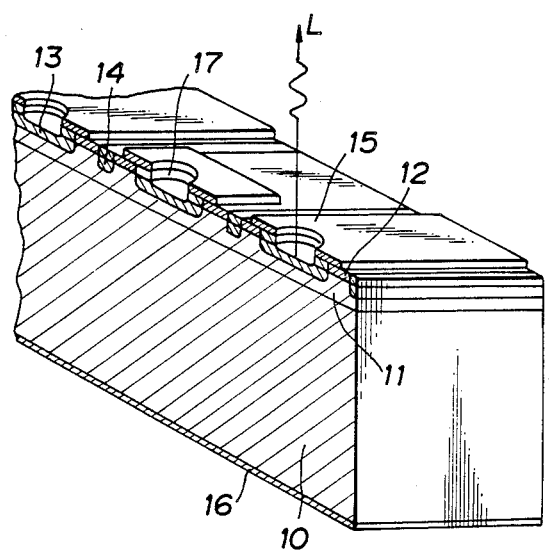
FIG. 4 is a cross-sectional perspective view along line IV—IV in FIG. 3 for illustrating the monolithic light emitting diode array.
Figure 5:
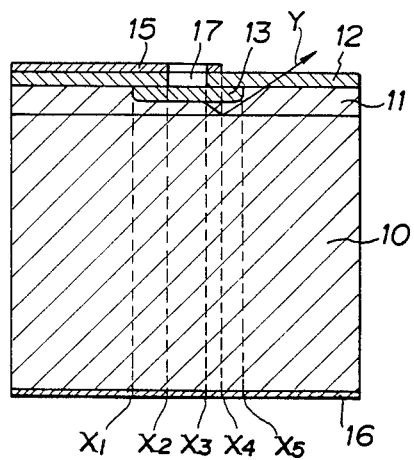
FIG. 5 is a cross-sectional view along line V—V in FIG. 3 for illustrating the monolithic light emitting diode array.
Figure 6:
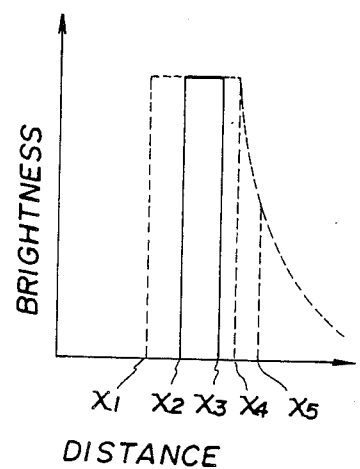
FIG. 6 is a view for explaining the brightness of light to be radiated from a prior art monolithic light emitting diode array.
Figure 7:
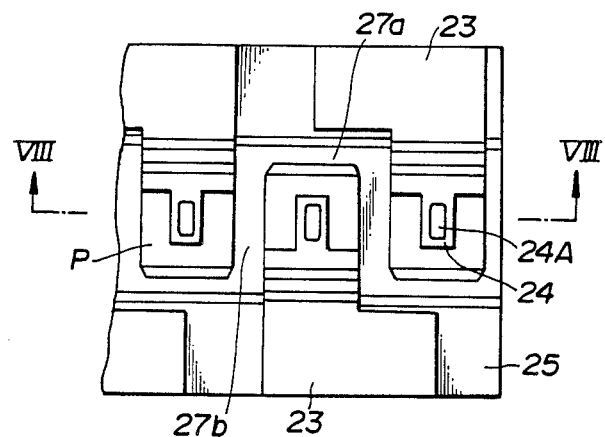
FIG. 7 is a plane view for illustrating a monolithic light emitting diode array of a preferred embodiment of the present invention.
Figure 8:
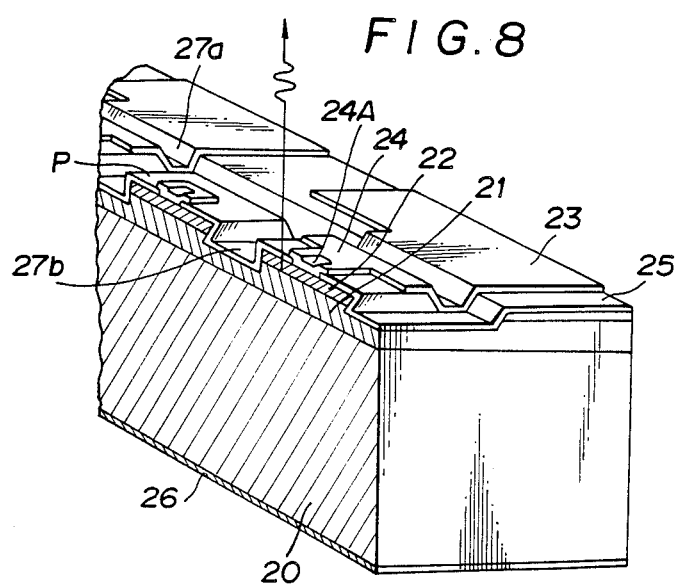
FIG. 8 is a cross-sectional perspective view along line VIII—VIII in FIG. 7 for illustrating the monolithic light emitting diode array.

There is shown in FIGS. 7 and 8 a monolithic light emitting diode array of a preferred embodiment of the present invention which comprises a P-type GaAs substrate 20, a P-type $Ga_{1-x}Al_x$ As layer 21 formed by epitaxial growth (wherein x is a mixed crystal ratio, and its value is 0.10 to 0.35 and depends upon a predetermined wavelength which is to be emitted), an N-type $G_{1-y}Al_yAs$ layer 22 formed on the P-type $Ga_{1-x}Al_xAs$ layer 21 by epitaxial growth (wherein y is a mixed crystal ratio), individual electrodes 23 of a metal evaporation layer formed on the N-type $G_{1-y}Al_yAs$ layer 22 and each having an electrode portion 24 (reference numeral 24A designates an electric contact point) to which a negative potential is applied, a layer of phospho-silicate-glass (PSG) film 25 for providing electrical isolation between the respective electrodes 23 and the N-type $G_{1-y}Al_yAs$ layer 22 except for the respective electric contact portions 24A, and a common electrode 26 of a metal evaporation layer formed on the whole back surface of the P-type GaAs substrate 20 and to which a positive potential is applied. In the monolithic light emitting diode array, the mixed crystal ratio y is larger than the mixed crystal ratio x so as to increase the light pervious effect with regard to the wavelength of light emitted from the P-type $G_{1-x}Al_xAs$ layer 21 and the injection efficiency of the electrons from the N-type $G_{1-y}Al_yAs$ layer 22 and to confine the minority carriers injected from the P-type $Ga_{1-x}Al_xAs$ layer 21. In the monolithic light emitting diode array, further, there are provided forward mesa etching grooves 27a and reverse mesa etching grooves 27b by which the respective light emitting diode portions P are electrically isolated from each other. As illustrated therein, the forward mesa etching grooves 27a are provided along the row of the light emitting diode portions P while the reverse mesa etching grooves 27b are provided between the respective light emitting diode portions P, and the individual electrodes 23 extend to the respective electrode portions 24 so as to cross the forward mesa etching grooves in coincidence with the concave surface shape thereof.

Figure 9:
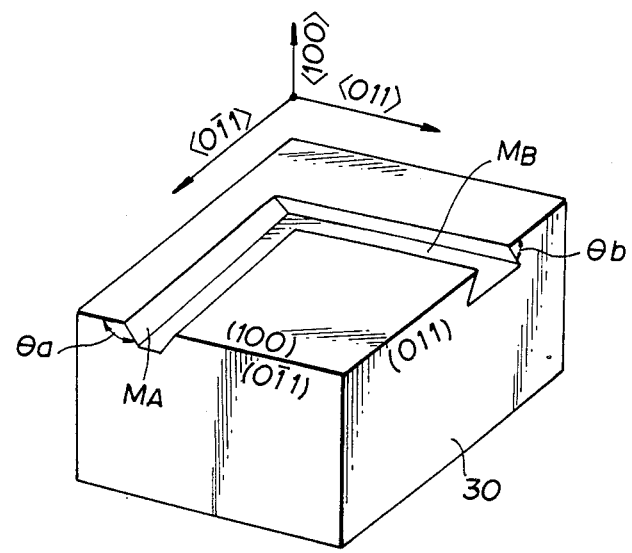
FIG. 9 is a perspective view for illustrating mesa etching grooves.

Here, the mesa etching groove is explained in conjunction with FIG. 9. In a semi-conductor crystal of III-V group compound of the zincblende type, amostropy can be generally found with regard to chemical etching speed and cleavage. Therefore, there is utilized a single crystal wafer having (100) face or face orientation similar thereto so as to manufacture a semi-conductor element or chip. As shown in FIG. 9, for instance, if the crystal substrate 30 is subject to mesa etching on a (100) fact in the directions of $<011>$ or $<0\bar{1}1>$ orthogonal thereto, the mesa etching angle $\Theta a$ is obtuse for the mesa etching groove $M_A$ while mesa etching angle $\Theta b$ is acute for the mesa etching groove $M_B$. The mesa etching groove $M_A$ is called the "forward mesa" and the mesa etching groove $M_B$ is called the "reverse mesa".

Figure 10A:
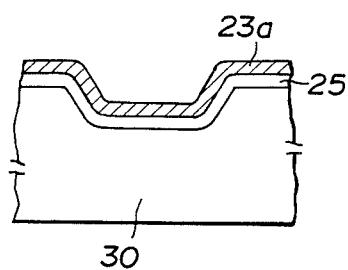
FIG. 10a and 10b are cross-sectional views for illustrating forward and reverse mesa etching grooves respectively.
Figure 10B:
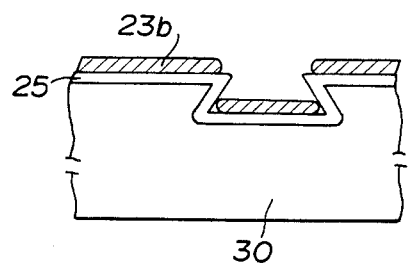

FIG. 10a shows the electric conducting layer 23a formed by metal evaporation which is provided through insulating layer 25 on the crystal substrate 30 having the "forward mesa etching groove" while FIG. 10b shows the electric conducting layer 23b provided on the crystal substrate 30 having the "reverse mesa etching groove".

As is clearly shown in FIGS. 10a and 10b, the electric conducting layer 23a does not have any disconnected portions while the electric conducting layer 23b tends to have disconnected points at the acute etching angle portions.

With reference again, to FIGS. 7 and 8, the monolithic light emitting diode array of a preferred embodiment of the present invention will be explained hereinafter.

In operation, a predetermined level of voltage is applied between the common positive electrode 26 and the individual negative electrodes 23 to cause a forward electric current to flow, that is to say, to inject electrons from the N-type $G_{1-y}Al_yAs$ layer 22 to the P-type $G_{1-x}Al_xAs$ layer 21, thereby resulting in the light emitting recombination so as to radiate light from the light emitting portions P.

In the embodiment, each of the individual electrodes 23 is shaped like the letter "L" so as to provide a wider area at the bottom thereof so that wire-bonding is easily performed at the area. Furthermore, each of the individual electrodes is shaped to have a narrow portion of the electrode portion 24 thereof so as to thereby provide a wider light radiating area of a pattern shaped like the letter "U" in the light emitting diode portion P.

Next, a more detailed explanation will be made in regard to the above mentioned embodiment of the present invention.

A P-type $Ga_{0.9}Al_{0.1}As$ layer of a carrier density: $5 \times 10^{16}$ cm$^{-3}$ and a thickness: 20$\mu$m, and then an N-type $Ga_{0.7}Al_{0.3}As$ layer of a carrier density: $2 \times 10^{17}$ cm$^{-3}$ and a thickness: 3$\mu$m are formed respectively on a (100) face of a P-type GaAs substrate doped with Zn having a carrier density: $2 \times 10^{18}$ cm$^{-3}$ and a thickness: 350$\mu$m by liquid phase epitaxial growth.

The substrate thus processed is subject to mesa etching on the surface thereof and two forward mesa etching grooves are provided in the direction of $<0\bar{1}1>$ orientation with regard to the (100) face. Simultaneously, a plurality of reverse mesa etching grooves are provided in the direction of $<011>$ orthogonal to the $<0\bar{1}1>$ direction between the two forward mesa etching grooves. As a result, a row of light emitting diode portions are provided in the direction of $<0\bar{1}1>$. In an example, each of the forward and reverse mesa etching grooves is of depth 5$\mu$m and each area of light emitting diode portions is of 45$\mu$m$\times$70$\mu$m.

Then, a PSG layer is grown to a thickness of 0.2$\mu$m so as to cover the whole surface of the substrate processed above. Thereafter, the PSG layer is removed by fluorine in the area: 5$\mu$m$\times$10$\mu$m on each portion corresponding to an electric contact portion.

A metal evaporation layer of Au-Ge alloy/Ni/Au is formed of a thickness: 0.1$\mu$m/0.2$\mu$m/0.5$\mu$m on the PSG layer at both sides of the light emitting diode portions to provide leads each extending from each of the electrode portions to each of the individual electrodes while crossing the forward mesa etching groove.

A common positive electrode is formed on the whole back surface of the substrate by a sequential metal evaporation of Au-Zn alloy/Ni/Au having thicknesses: 0.1$\mu$m/0.2$\mu$m/0.5$\mu$m respectively. Thus, U-shaped light radiating areas are provided as a result of having their light emitting diode portions covered by electrode portions respectively with a 10$\mu$m$\times$30$\mu$m area, thereby having three times the light radiating area as compared to the prior art.

Sixteen (16) light emitting diode portions are arranged per 1 mm. Accordingly, one hundred twenty eight (128) light emitting diode portions are accommodated in a chip of the size: 1.6$\times$8 mm$^2$. This means that a light emitting diode array having picture element: 16/1 mm is provided for exposure means in an electrostatic recording apparatus.

According to a mesa type monolithic light emitting diode array thus produced, the threshold voltage is 1.5V, and the electric current is more than 10 mA at a forward voltage 2.0V. In addition, it withstands a reverse voltage up to 7V and the wave-length of the light generated is 800 mm.

According to a mesa type monolithic light emitting diode array of the present invention, furthermore, there cannot be found any disconnected point in the individual electrodes crossing the forward mesa etching groove at the manufacturing stage so that the yield is increased up to 100 percent, and no disconnection or breaking of the individual electrodes occurs even after a load test of 2,000 hours.

As mentioned above, the light radiating area is greater than in the prior art, and the light generation efficiency is increased, and light emitting diode portions having uniform characteristics are manufactured in the present invention.

In the above, embodiment, a P-type GaAs is used as a substrate crystal. However, an N-type GaAs may be adopted as well. In such a case, the common electrode is supplied with a negative potential while individual electrodes are supplied with a positive potential.

Furthermore, the mixed crystal layer formed on GaAs substrate is not limited to GaAlAs, but may be of other mixed crystal substances.

Figure 11:
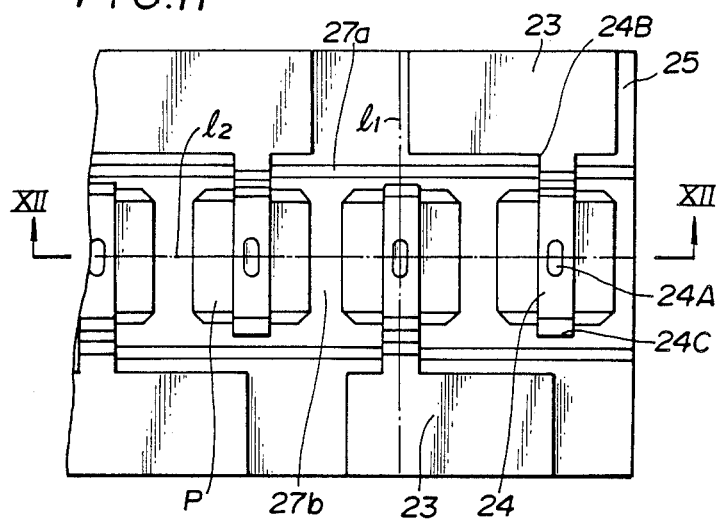
FIG. 11 is a plane view for illustrating a monolithic light emitting diode array of another preferred embodiment of the present invention.
Figure 12:
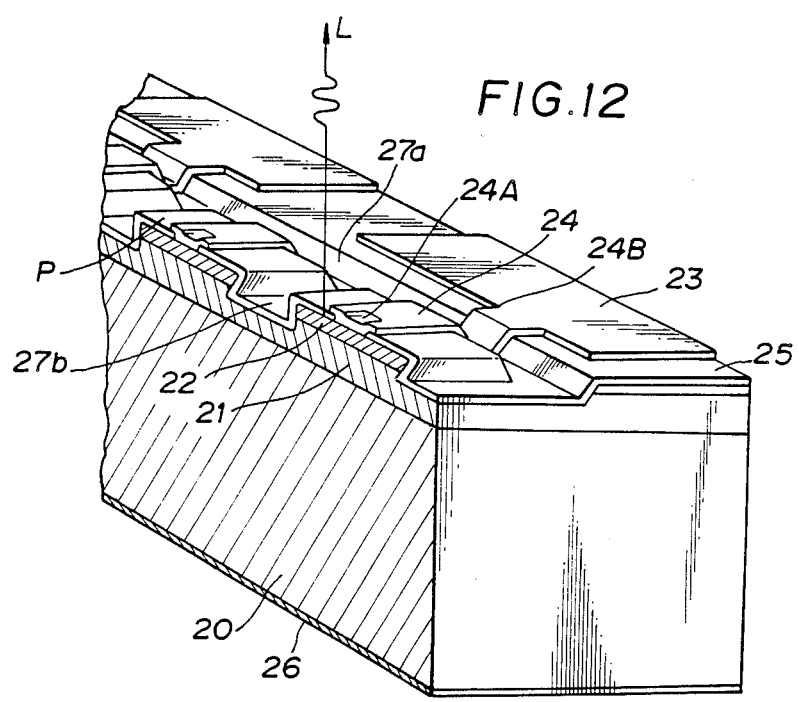
FIG. 12 is a cross-sectional perspective view along line XII—XII in FIG. 11 for illustrating the monolithic light emitting diode array.

FIGS. 11 and 12 show another embodiment of the present invention wherein like references designate like parts in FIGS. 7 and 8. The difference can be found in the pattern of the individual electrodes 23 having electrode portions 24 between the former and present embodiments. That is to say, each of individual electrodes 23 is provided with an electrode portion 24 which extends from a point 24B (before reaching a forward mesa etching groove 27a) to a point 24C (beyond a light emitting diode portion P). As a matter of course, an electric contact point 24A of the electrode portion 24 is positioned in the center of the light emitting diode portion P.

According to the second embodiment of a monolithic light emitting diode array, an electrode portion 24 is provided in symmetric pattern with regard to lines 1 and 2 as shown in FIG. 11 so that a symmetrical light generation is obtained to provide uniform light exposure with regard to scanning and subscanning directions in an electrostatic recording apparatus.

Figure 13:
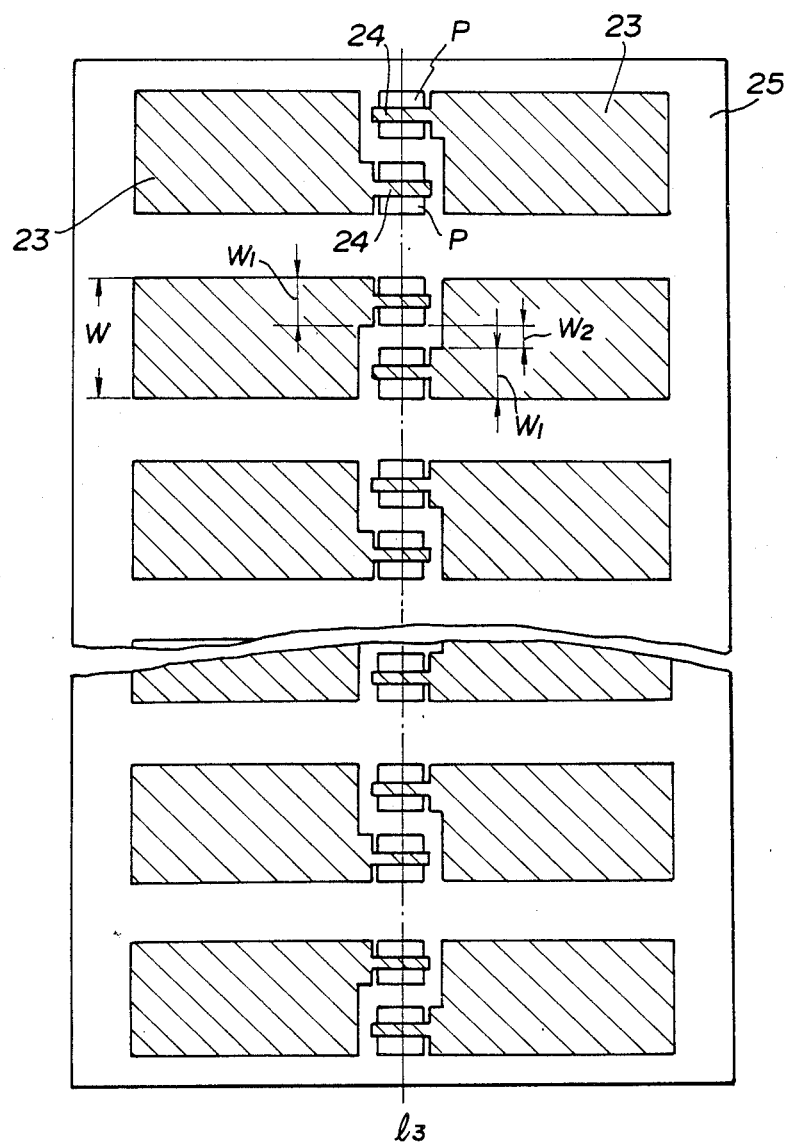
FIG. 13 is a plane view for illustrating a monolithic light emitting diode array of yet another preferred embodiment of the present invention.

FIG. 13 shows a further embodiment of the present invention wherein a monolithic light emitting diode array is characterized in that a plurality of pairs of light emitting diode portions P are provided, and individual electrodes 23 are provided in symmetrical position and configuration with regard to line 3. The width W of the individual electrode 23 is equal to the sum of $W_1 + W_2 + W_1$ wherein $W_1$ is the L width of the light emitting diode portion P and $W_2$ is the gap between the light emitting diode portion P, that is, the width of reverse mesa etching groove which is not shown as well as forward mesa etching groove for illustrative purpose.

Figure 14:
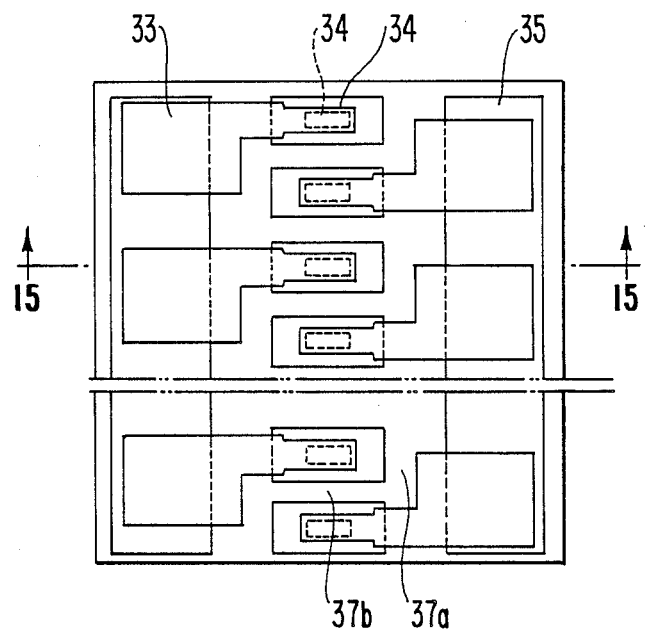
FIG. 14 is a plane view for illustrating a monolithic light containing diode array of still another embodiment of the present invention.
Figure 15:
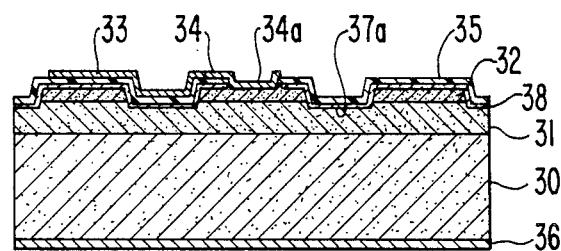
FIG. 15 is a cross-sectional view along line XV—XV in FIG. 14.

In FIGS. 14 and 15, there is shown a light emitting diode in another embodiment according to the present invention. The light emitting diode comprises a GaAs crystal substrate 30, a p-GaAlAs layer 31, an n-GaAlAs layer 32, individual electrodes of a metal evaporation layer each having an electrode portion 34 (reference numeral 34a designates an electric contact point), an electrical isolation and protection film 35, a common electrode 36 and a layer of P-SiO$_2$ glass film or a layer of B-SiO$_2$ glass film 38. In the light emitting diode, a forward and reverse mesa etching grooves 37a and 37b are provided in the same manner as shown, for instance, in FIG. 8 of the present application.

EXAMPLE 1

Light emitting regions are formed so as to be separated from other regions in accordance with the etching of an n-GaAlAs layer 32. The substrate, thus provided with the light emitting regions, is put into a normal pressure CVD apparatus in which the temperature of a means for holding a substrate is maintained at 400° C. so that a P-SiO$_2$ glass film of a thickness of 0.2 μm and a 1% by weight phosphorus density is grown using SiH$_4$, O$_2$ and PH$_3$ gases. The PH$_3$ gas is then shut off, and a SiO$_2$ film of a thickness of 0.8 μm is grown thereon. Thereafter, electrodes 33 and 36 are provided by a conventional method so as to fabricate a complete light emitting diode array.

EXAMPLE 2

The glass film 38 including P or B and the electrical isolation and protection film 35 are grown as follows.

In the aforementioned apparatus, under the conditions of an N$_2$ carrier gas having a flow of 12 l/min together with a SiH$_4$ gas having a flow of 0.8 l/min by 4% with respect to the N$_2$ gas, a PH$_3$ gas with a flow of 1.0 l/min by 1% with respect to the N$_2$ gas, and an O$_2$ gas with a flow of 0.6 l/min, a P-SiO$_2$ glass film 38 of a thickness of 0.2 μm and having a P density of 12 percent by weight is grown. Thereafter, the PH$_3$ gas is gradually reduced, and shut off when a deposition thickness thereof reaches 0.8 μm. The deposition is further continued using only the SiH$_4$ and O$_2$ gases to provide an electrical isolation and protection film 35 of a thickness of 1.0 μm. Thereafter, electrodes 33 and 36 are provided to fabricate a light emitting diode array.

EXAMPLE 3

An embodiment in which a glass film including boron is grown will be explained.

In the normal pressure CVD apparatus as mentioned above, a substrate on which light emitting regions are formed so as to be separated from other regions is set on the substrate holding means which has been heated to 400° C. wherein a B-SiO$_2$ glass film 38 of a thickness of 0.2 μm and including boron of 12% by weight is grown under the conditions of the SiH$_4$ gas having a flow of 0.8 l/min by 4% with respect to the N$_2$ gas, the B$_2$H$_6$ gas having a flow of 0.8 l/min by 4% with respect thereto, the O$_2$ gas having a flow of 0.6 l/min, and the N$_2$ gas having a flow of 12 l/min. Thereafter, the B$_2$H$_6$ gas is shut off to provide a deposition of SiO$_2$ having a thickness of 0.8 μm. Then, the light emitting diode array fabrication is completed in a conventional manner.

EXAMPLE 4

An embodiment in which a composite film including a P-SiO$_2$ glass film and a Si-nitride film is grown will be explained.

After the deposition of a 0.2μm P-SiO$_2$ glass film as described in Example 2, the substrate is set in a plasma CVD apparatus having two parallel facing electrodes in which a substrate holding means is maintained at a temperature of 320° C. Under the conditions of the SiH$_4$ gas having a flow of 40 ml/min by 20% with respect to the N$_2$ gas, an NH gas having a flow of 80 ml/min and the N$_2$ gas having a flow of 70 ml/min, a pressure of 0.2 Torr, and a high frequency power of 200 W, the Si-nitride film is grown to a 0.8 μm thickness so as to provide a composite film 38. Then, the light emitting diode array fabrication is completed in a conventional manner.

In the example 4, a CF4 gas including the $O_2$ gas by 4% is utilized to perform a plasma dry etching so as to provide apertures for contacts 34a.

TEST RESULTS

The light emitting diode array elements obtained in the examples 1 to 4 are divided into two groups. One group of light emitting diode array elements were positioned in a thermostatic chamber of 125° C. and taken therefrom after predetermined period to be observed with regard to the surface conditions thereof. No crack or resultant exfoliation was produced on an electrical isolation and protection film 35 even after the lapse of 1000 hours. The remaining groups of light emitting diode array elements were subjected to a cooling and heating cycle test in which they were cooled at a temperature of $-25°$ C. for 30 minutes and then heated at a temperature of 125° C. for 30 minutes. Even after this test was performed for 500 cycles, no crack or exfoliation was observed on an electrical isolation and protection film 35.

As a matter of course, no crack or exfoliation was produced during the process for fabricating a light emitting diode array.

It will be apparent to those skilled in the art that various changes and modifications may be made within the spirit of the above teachings. Also, in view of the above, the present invention may be embodied in other specific forms without departing from the spirit or essential attributes thereof and, accordingly, reference should be made to the appended claims, rather than to the foregoing specification as indicating the scope of the invention.

We claim:

1. A monolithic light emitting diode array comprising:
   at least one mixed crystal layer formed on a GaAs substrate by epitaxial growth to provide a P-N junction at the boundary surface thereof, said mixed crystal layer including either a p-GaAlAs layer or a n-GaAlAs layer grown on said GaAs substrate;
   a row of a plurality of light emitting diode portions each having said P-N junction;
   two forward mesa etching grooves each provided on opposite sides of said row of a plurality of light emitting diode portions;
   a plurality of reverse mesa etching grooves each provided so as to be orthogonal to said two forward mesa etching grooves and positioned between said plurality of light emitting diode portions;
   a plurality of individual electrodes each having an electrode portion corresponding to each of said plurality of light emitting diode portions and being arranged alternately on opposite sides of said row of plurality of light emitting diode portions so as to cross the corresponding one of said two forward mesa etching grooves in coincidence with a concave surface shape thereof;
   a common electrode provided on a back surface of said substrate; and
   an electric isolation protection film consisting of an $SiO_2$ film, and an interposed film consisting of a P-$SiO_2$ glass film formed between said electric isolation protection film and the surface of said p-GaAlAs layer or n-GaAlAs layer grown on the GaAs substrate.
   wherein said electrode portion is narrower than said each of said plurality of light emitting diode portions so that light radiates in a direction orthogonal to a plane of said P-N junction, each of said plurality of individual electrodes is much wider than said each of said plurality of light emitting diode portions so as to facilitate a wirebonding thereon, and
   said interposed film of P-$SiO_2$ is formed so as to have a content of P which is gradually decreased in the direction toward said electric isolation film by reducing a flowing amount of a P-compound gas in a CVD process, whereby said electric isolation protection film of $SiO_2$ film is formed by continuing a deposition in said CVD process in a state such that said flowing amount is zero.

2. A monolithic light emitting diode array according to claim 1, wherein said interposed film of P-$SiO_2$ has a P-content of 12% by weight at a contact portion with said surface of said P-GaAlAs or n-GaAlAs layer.

* * * * *